(12) United States Patent
Kim

(10) Patent No.: US 7,269,064 B2
(45) Date of Patent: Sep. 11, 2007

(54) METHOD OF CONTROLLING PAGE BUFFER HAVING DUAL REGISTER AND CIRCUIT THEREOF

(75) Inventor: Eui Suk Kim, Kyungki-Do (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 375 days.

(21) Appl. No.: 11/008,362

(22) Filed: Dec. 9, 2004

(65) Prior Publication Data

US 2005/0254301 A1 Nov. 17, 2005

(30) Foreign Application Priority Data

May 14, 2004 (KR) .................... 10-2004-0034450

(51) Int. Cl.
*G11C 7/10* (2006.01)
*G11C 11/4093* (2006.01)
(52) U.S. Cl. .................... 365/185.12; 365/185.08; 365/189.05
(58) Field of Classification Search ........... 365/189.08, 365/189.05, 185.12, 230.06
See application file for complete search history.

(56) References Cited

U.S. PATENT DOCUMENTS 6,671,204 B2 * 12/2003 Im ..................... 365/185.12
6,813,184 B2 * 11/2004 Lee .................... 365/185.09
6,963,509 B1 * 11/2005 Ju ...................... 365/189.05
7,042,770 B2 * 5/2006 Lee et al. ............. 365/189.05
7,061,813 B2 * 6/2006 Lee .................... 365/189.05
7,149,130 B2 * 12/2006 Lee .................... 365/189.05
2003/0117856 A1 6/2003 Lee et al.

FOREIGN PATENT DOCUMENTS

KR 20030011234 2/2003
KR 20050101874 10/2005

* cited by examiner

*Primary Examiner*—Amir Zarabian
*Assistant Examiner*—Michael Weinberg
(74) *Attorney, Agent, or Firm*—Marshall, Gerstein & Borun LLP

(57) ABSTRACT

Disclosed are a method of controlling a page buffer having a dual register and a control circuit thereof. In the present invention, during a normal program operation, a normal program operation is performed through the same transmission path as a data transmission path along which data is outputted from bit lines of a memory cell array to a YA pad according to a signal PBDO used in a read operation. A program operating time can be reduced and the whole program operation of a chip can be thus reduced. It is also possible to reduce current consumption by shortening a data path during the normal program operation.

4 Claims, 4 Drawing Sheets

METHOD OF CONTROLLING PAGE BUFFER HAVING DUAL REGISTER AND CIRCUIT THEREOF

BACKGROUND

1. Field of the Invention

The present invention relates to a method of controlling a page buffer having a dual register and a control circuit thereof. More specifically, the present invention relates to a method of controlling a page buffer having a dual register in which the entire program time can be reduced through reduction in a program time upon normal program, and a control circuit thereof.

2. Discussion of Related Art

Recently, there is an increasing demand for semiconductor memory devices that can be electrically programmed and erased and do not require a refresh function to rewrite data in a predetermined period. Further, in order to develop a large-capacity memory device in which lots of data can be stored, research has been actively made into high-integration technology of the memory device. In the above, the program refers to an operation for writing data into a memory cell and the erasure refers to an operation for erasing data written in the memory cell.

For higher-integration of a memory device, a NAND-type flash memory device in which a plurality of memory cells are serially connected (i.e., a structure in which neighboring cells share drain or source) to constitute one string was developed. The NAND-type flash memory device is a memory device that reads information sequentially unlike a NOR-type flash memory device. Program and erasure of this NAND-type flash memory device are performed by controlling the threshold voltage of the memory cell while injecting or discharging electrons into or from a floating gate through the F-N tunneling method.

The NAND-type flash memory device employs a page buffer in order to store a large capacity of information within a short time. The page buffer provides a large quantity of data received from an input/output pad I/O PAD to the memory cells. The page buffer typically consists of a single register in order to temporarily store data. Recently, however, the page buffer is composed of a dual register in order to increase the program speed upon large-capacity data program in the NAND-type flash memory device.

For example, a conventional page buffer having the dual register is shown in FIG. 4. In FIG. 4, reference numerals P1 to P4 indicate a PMOS transistor, N1 to N18 indicates a NMOS transistor, and HN1 to HN4 indicates a high voltage NMOS transistor.

Referring to FIG. 4, the conventional page buffer having the dual register performs a program operation on memory cells of a memory cell array 10 according to data received from the I/O pad during a program operation. This page buffer includes a cache register 23, and a main register 22 that stores data received from the cache register 23 and provides the data to the memory cell array 10 depending upon the operation of a bit line select unit 21.

The operational properties when the page buffer shown in FIG. 4 performs the program operation will now be described.

During the program operation, a node passing through a pad YA is grounded. In this state, if '1' data is received from the input/output pad, a control signal DI1 being a data-in signal is activated. Thus, transistors N13 and N14 are turned on and an input terminal Qab of a latch unit 231 of the cache register 23 thus shifts to a LOW level. On the contrary, if '0' data is received from the input/output pad, a control signal nDI being a data-in signal is activated. Thus, a transistor N15 is turned on and an output terminal QA of the latch unit 231 of the cache register 23 shifts to a LOW level. In other words, according to data received from the input/output pad, data having a given value is stored in the latch unit 231 of the cache register 23 and is transmitted to the main register 22 via a node SD through a transistor N16 that is turned-on by a control signal PDUMP. Then, the data is stored in a latch unit 221. The data stored in the latch unit 221 of the main register 22 is transmitted to the plurality of the memory cells of the memory cell array 10 through a bit line select unit 21, so that the program operation is performed.

In the conventional page buffer shown in FIG. 4, the above-mentioned operation is performed in the same manner upon normal program as well as a cache program. Generally, the program operation can be divided into the normal program and the cache program in which data is stored in the cache register 23 in advance and the program is then performed in order to increase the program speed. In this time, the normal program refers to a program operation wherein a data program is performed once. The cache program refers to a program operation in which a program should be performed consecutively several times. Generally, during the normal program operation, a normal program command signal indicating a program operation command signal, an address signal, data and a normal program operation are inputted to the input/output pad. On the contrary, during the cache program operation, a cache program command signal indicating a program operation command signal, an address signal, data and a cache program operation are inputted to the input/output pad. That is, the normal program and the cache program are divided through the normal program command signal and the cache program command signal.

As described above, in the conventional page buffer, during the normal program and the cache program operation, a process in which data is transferred to the main register 22 via the cache register 23 and is then transmitted to the memory cell array 10 is performed. In other words, during all the program operations (including the normal program and cache program), a process in which data is transferred from the cache register 23 to the main register 22 is carried out. Time taken to transmit data from the cache register 23 to the main register 22 is approximately 3 μs. Of course, the program speed can be increased in the case of the cache program using the cache register 22 that is used to program a large capacity of data. However, there is a problem in that a transfer time needed for transmitting data from the cache register 23 to the main register 22 is unnecessarily consumed in the case of the normal program.

SUMMARY OF THE INVENTION

Accordingly, the present invention has been made in view of the above problems, and it is an object of the present invention to provide a method of controlling a page buffer having a dual register in which the entire program time can be reduced through reduction in a program time upon normal program, and a control circuit thereof.

To achieve the above object, according to an aspect of the present invention, there is provided a method of controlling a page buffer wherein the page buffer includes transistors connected between bit lines and a pad (YA), wherein the transistors are driven according to a first signal that is enabled according to a read enable signal upon read operation to output a first data of a memory cell from the bit lines to a node passing through the pad (YA), and a dual register having first and second registers that are enabled according to a second signal enabled during first and second program operations to transmit a second data from a node passing through the pad (YA) to the bit lines, wherein during the first program operation, when a cache program signal that enables the second signal is kept at a first level and a write enable signal is toggled, the first signal shifts to a second level to turn on the transistors, so the data passing through the pad (YA) is directly transmitted to the bit lines through the transistors without passing through the first and second registers, and wherein during the second program operation the cache program signal and the read enable signal are kept at the second level to output the first signal disabling the transistors and the second signal enabling the first and second registers, so the data passing through the pad (YA) is transmitted to the bit lines through the first and second registers.

A control circuit of a page buffer, wherein the page buffer includes transistors connected between bit lines and a pad (YA), wherein the transistors are driven according to a first signal that is enabled according to a read enable signal upon read operation to output a first data of a memory cell from the bit lines to a node passing through the pad (YA), and a dual register having first and second registers that are enabled according to a second signal enabled during first and second program operations to transmit a second data from a node passing through the pad (YA) to the bit lines, wherein during the first program operation, when the read enable signal is kept at a second level, a cache program signal that enables the second signal is kept at a first level and a write enable signal is toggled, the first signal shifts to a second level to turn on the transistors, so the data passing through the pad (YA) is directly transmitted to the bit lines through the transistors without passing through the first and second registers, and wherein during the second program operation, the cache program signal and the read enable are kept at the second level to output the first signal disabling the transistors and the second signal enabling the first and second registers, so the data passing through the pad (YA) is transmitted to the bit lines through the first and second registers.

DETAILED DESCRIPTION OF PREFERRED EMBODIMENTS

Figure 1:
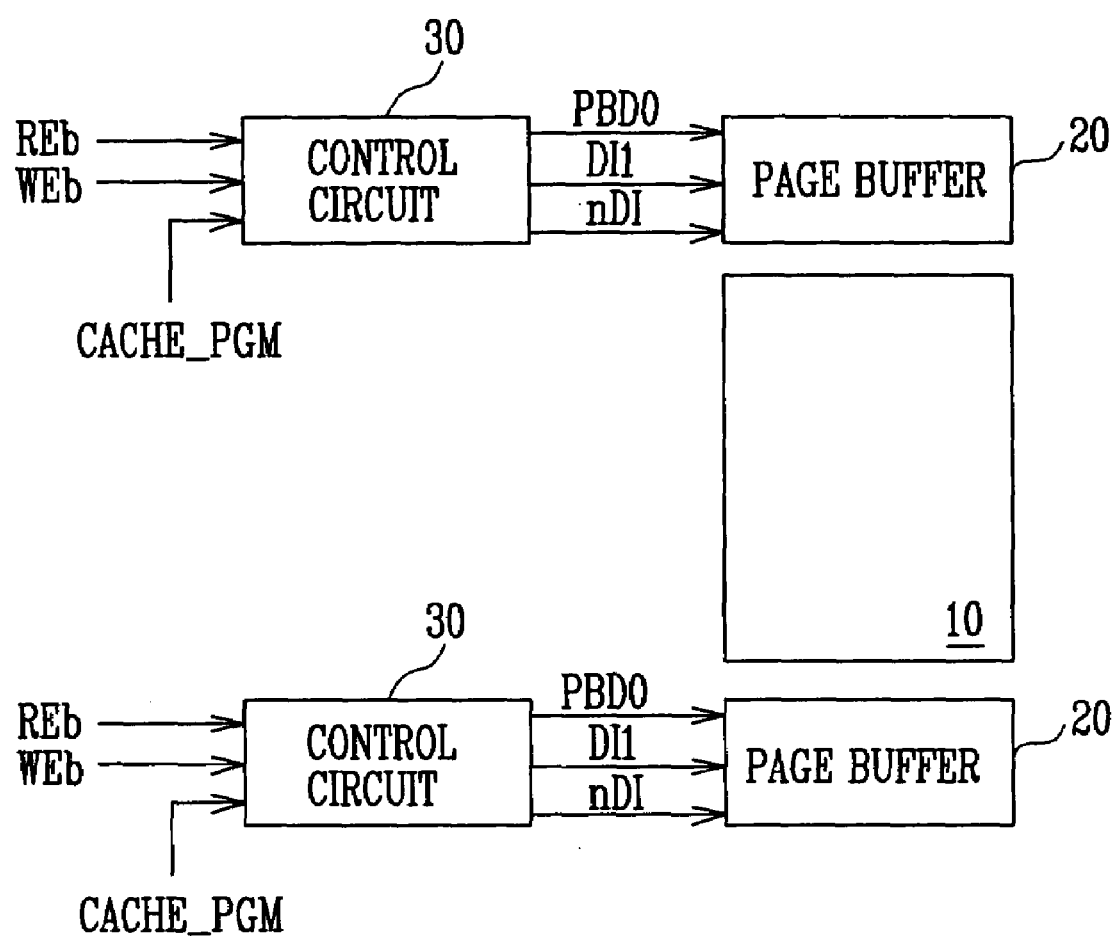
FIG. 1 is a circuit diagram showing a control circuit of a page buffer having a dual register according to a preferred embodiment of the present invention.

Now the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later. Further, in the drawing, like reference numerals are used to identify the same or similar parts.

Figure 2:
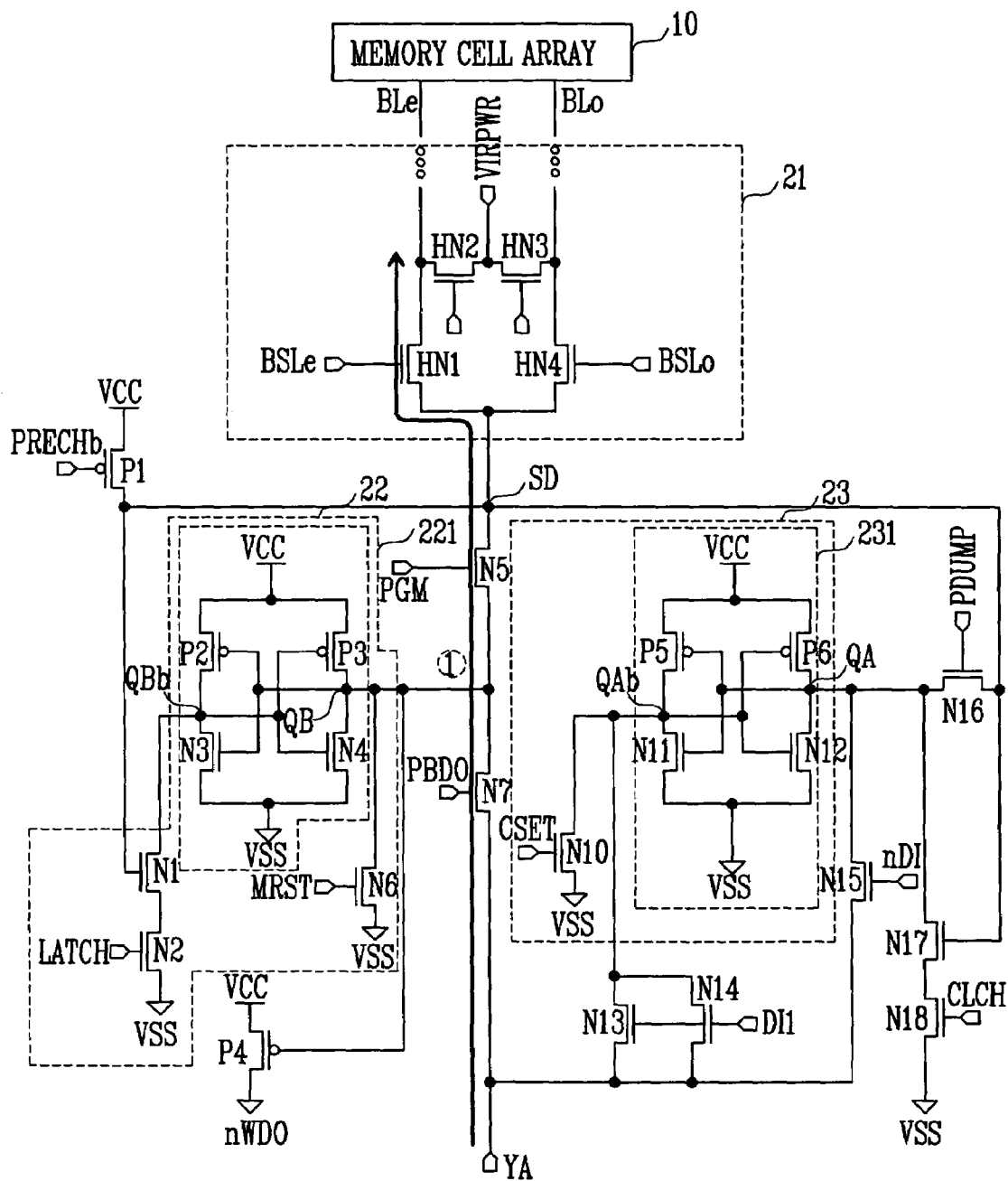
FIG. 2 is a detailed circuit diagram of the page buffer shown in FIG. 1.
Figure 3:
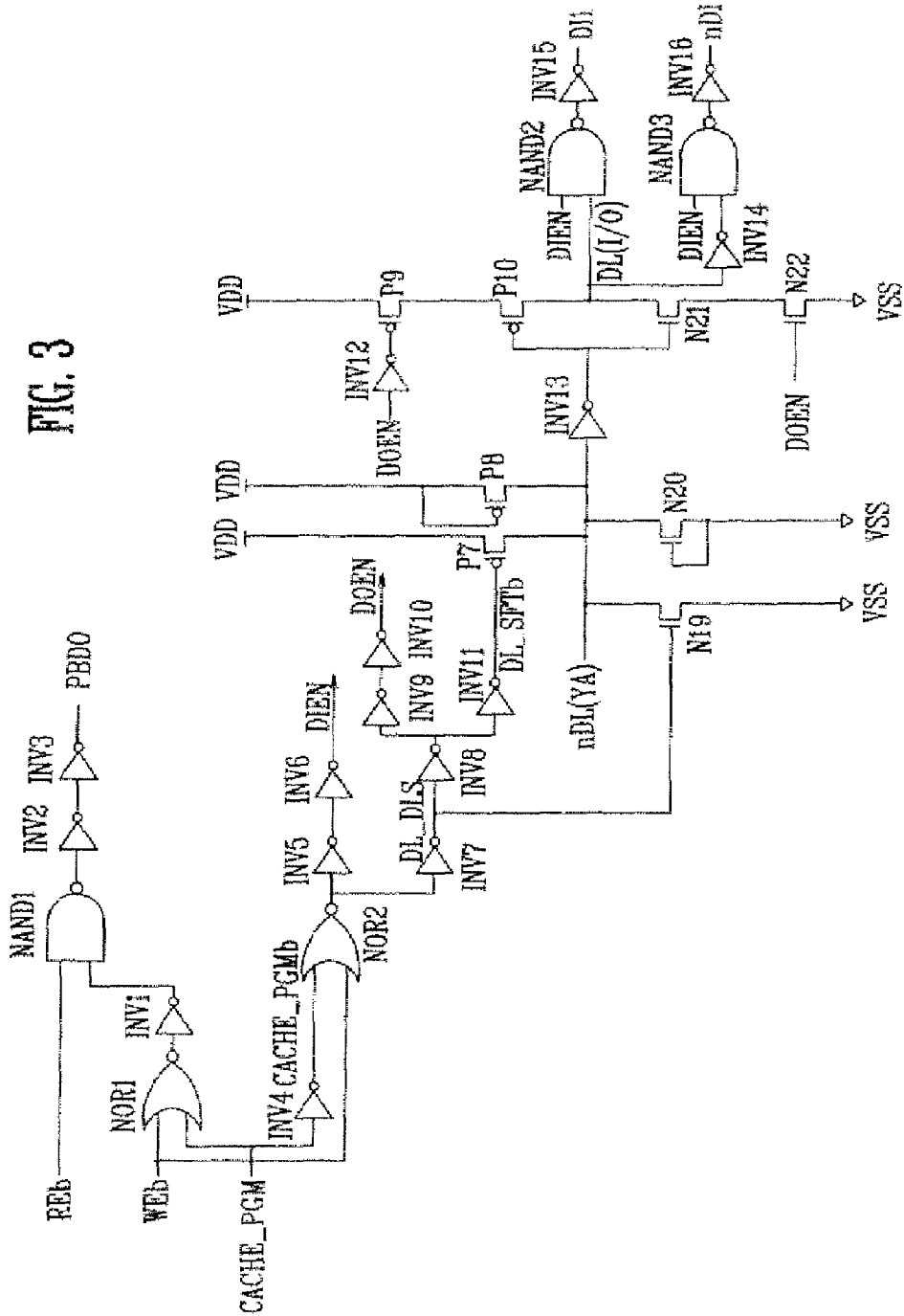
FIG. 3 is a detailed circuit diagram of the control circuit shown in FIG. 1.

FIG. 1 shows the construction of as semiconductor memory devise that is shown to explain a method of controlling a page buffer having a dual register according to a preferred embodiment of the present invention. FIG. 2 shows the construction of the page buffer shown in FIG. 1. FIG. 3 shows the construction of the control circuit shown in FIG. 1. In FIG. 2, the same reference numerals as those shown in FIG. 4 have the same function. Thus, detailed description on them will be omitted for purposes of simplicity. Further, a REb signal is a read enable signal, a WEb signal is a write enable signal, a VIRPWR signal is a node providing signal, a BSLo signal is an odd bitline selection signal, a BSLe is an even bitline selection signal, a CLCH signal is a cache latch signal, a MRST signal is a main latch reset signal to make a voltage level of a node QB have a ground level, a PGM signal is a program signal, a PRECHb is a precharge signal, an nWDO signal is a program-verify signal, a LATCH signal is a main latch signal to make a voltage level of a node QBb have a ground level, a CSET signal is a cache register set signal, and a CACHE_PGM signal is a cache program enable signal. The CACHE_PGM signal keeps '1' during a cache program operation and keeps '0' during a normal program operation.

Referring to FIGS. 1 to 3, in the method of controlling the page buffer according to a preferred embodiment of the present invention, during the normal program operation, data that passes through a pad (YA) is transmitted to a memory cell array 10 through a NMOS transistor N7 according to a PBDO signal from a control circuit 30. The control circuit 30 is usually referred to as a 'Y-control circuit' and enables ('1') the PBDO signal using REb, WEb and CACHE_PGM signals during the normal program operation, thereby turning on the NMOS transistor N7. As the NMOS transistor N7 is turned on, data passing through the pad (YA) is transmitted to one of bit lines BLe and BLo of the memory cell array 10 through the NMOS transistor N7. In this time, the NMOS transistor N5 keeps turned on. This control circuit 30 can be constructed as shown in FIG. 3. As shown in FIG. 3, the control circuit 30 includes NAND gates NAND1 to NAND3, NOR gates NOR1 and NOR2, inverters INV1 to INV16, PMOS transistors P1 to P4, and NMOS transistors N1 to N4.

Hereinafter, the operational characteristics of the control circuit 30 and the method of controlling the page buffer according to a preferred embodiment of the present invention will be described in a detailed manner with reference to FIGS. 1 to 3.

During the normal program operation, the signal REb is kept at a HIGH level and the signal CACHE_PGM is kept at a LOW level. In this state, whenever the signal WEb is toggled, the signal PBDO is outputted as a HIGH level. In the concrete, if the signal CACHE_PGM is inputted as a LOW level, the NOR gate NOR1 outputs a signal of a HIGH level or a LOW level depending upon the signal WEb. For example, if the signal WEb is inputted as a LOW level, the NOR gate NOR1 outputs a signal of a HIGH level. This signal is inverted to a LOW level by the inverter INV1. The NAND gate NAND1 outputs a signal of a HIGH level. Therefore, the signal PBDO is outputted as the HIGH level. That is, whenever the signal WEb is at a LOW level, the signal PBDO is outputted as the HIGH level. The signal PBDO shifts to a HIGH level and the transistor N7 is thus turned on.

Meanwhile, during the normal program operation the signal REb is kept at a HIGH level and the signal CACHE— PGM is kept at a LOW level. Thus, the signals DI1 and nDI become a LOW level. Accordingly, the NMOS transistors N13 to N15 are turned off and the cache register 23 is thus not enabled. In the concrete, the NOR gate NOR2 always outputs a signal of the LOW level regardless of the signal WEb when the signal CACHE_PGMb is received as a HIGH level. Thus, the signal DIEN is outputted as a LOW level, the signal DL_DLS is outputted as a HIGH level, the signal DOEN is outputted as a LOW level and the signal DL_SFTb is outputted as a HIGH level. As the signal DIEN is outputted as the LOW level, both the signals DI1 and nDI become a LOW level regardless of the state of the signal DL. The cache register 23 is thus not enabled.

During the cache program operation, the signal REb is kept at a HIGH level and the signal CACHE_PGM is kept at a HIGH level. In this state, the signal PBDO is always outputted as a LOW level regardless of the state of the signal WEb. As the signal PBDO is outputted as the LOW level, the transistor N7 is turned off and a data transmission path via the NMOS transistor N7 is shut off. In the concrete, if the signal CACHE_PGM is inputted as a HIGH level, the NOR gate NOR1 outputs a signal of a LOW level regardless of the state of the signal WEb. The output signal of the NOR gate NOR1 is inverted to a HIGH level by the inverter INV1 and is then inputted to the NAND gate NAND1. The NAND gate NAND1 outputs a signal of a LOW level as the signal REb is received as a HIGH level. The signal PBDO is thus outputted as a LOW level.

Figure 4:
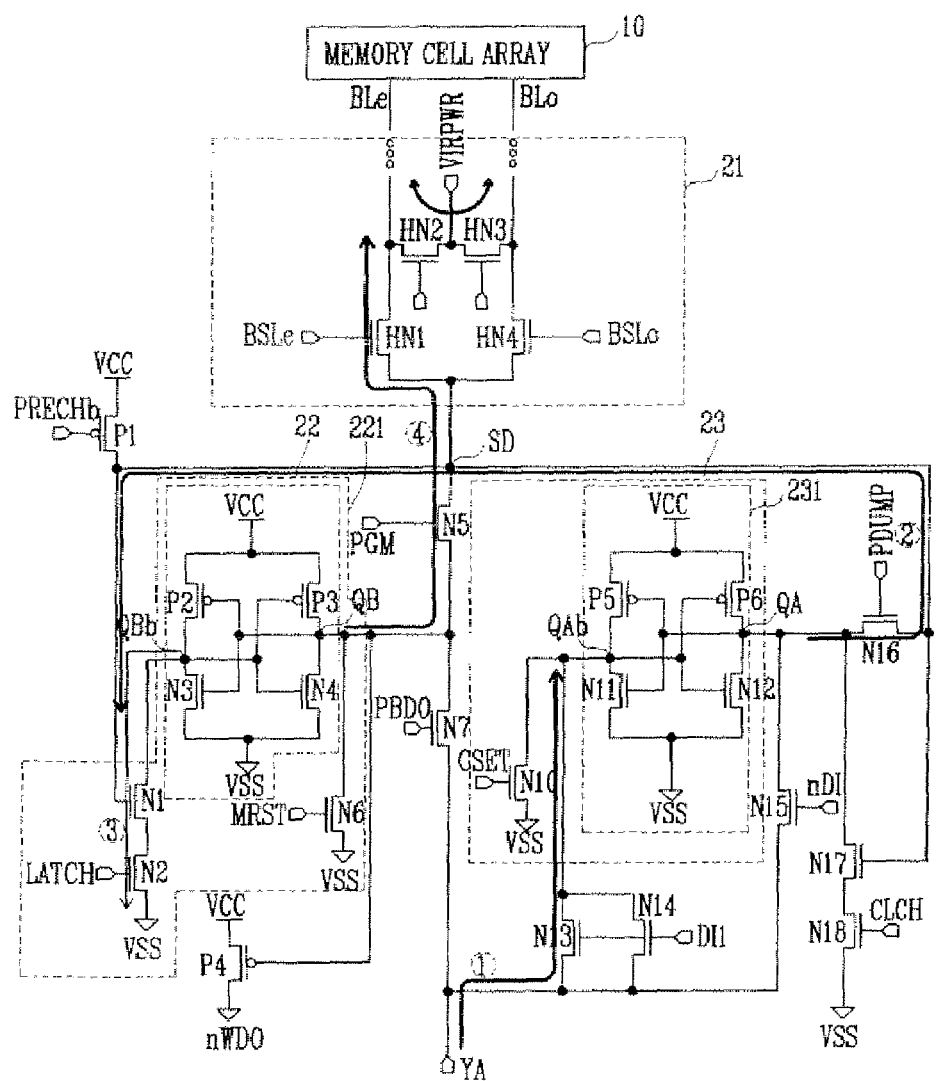
FIG. 4 is a detailed circuit diagram shown to explain the operating properties of a typical page buffer.

Meanwhile, during the cache program operation, the cache register 23 is enabled and data is thus inputted to any one of the bit lines BLe and BLo through steps (1, 2, 3 and 4) shown in FIG. 4. One of the signal DI1 and the signal nDI becomes a HIGH level depending upon data inputted to the I/O pad. In the case where data is 1, the signal nDI becomes a HIGH level and the NMOS transistor N15 is thus turned on. If the data is '0', the signal DI1 becomes a HIGH level and the NMOS transistors N13 and N14 are thus turned on. In the concrete, the signal REb is kept at a HIGH level and the signal CACHE_PGM is kept at a HIGH level. The NOR gate NOR2 outputs a signal of a HIGH level if the signal CACHE_PGMb is received as a LOW level and the signal WEb is received as a LOW level. Accordingly, the signal DIEN becomes a HIGH level, the signal DL_DLS becomes a LOW level, the signal DOEN becomes a HIGH level and the signal DL_SFTB becomes a LOW level. As the signal DL_SFTb is outputted as the LOW level, the PMOS transistor P7 is turned on, a node nDL(YA) shifts to a HIGH level and the PMOS transistor P10 is turned on by the inverter INV13 that outputs a signal of a LOW level. In this time, the PMOS transistor P9 is turned on by the signal DOEN of a high level. Therefore, as the node DL(I/O) shifts to a HIGH level, the signal DI1 becomes a HIGH level and the signal nDI becomes a LOW level. Accordingly, the NMOS transistors N13 and N14 are turned on and the NMOS transistor N14 is turned off. Therefore, the data '0' inputted to the pad (YA) is transmitted to the latch unit 231 of the cache register 23 via the NMOS transistors N13 and N14.

As described above, in the method of controlling the page buffer having the dual register according to a preferred embodiment of the present invention, during the normal program operation, the signal PBDO shown in FIG. 2 is enabled to turn on the NMOS transistor N7 and to disable the cache register 23 in the same manner as the read operation. Accordingly, the data passing through the pad (YA) is directly transmitted to the bit lines through the NMOS transistor N7 without passing through the cache register 23. Further, during the cache program operation, program is performed using the cache register 23. Therefore, according to the method of controlling the page buffer having the dual register according to a preferred embodiment of the present invention, the program operating time can be reduced.

As described above, according to the present invention, during a normal program operation, a normal program operation is performed through the same transmission path as a data transmission path along which data is outputted from a memory cell array to a node passing through a pad (YA) according to a signal PBDO used in a read operation. Therefore, a program operating time can be reduced and the whole program operation of a chip can be thus reduced. It is also possible to reduce current consumption by shortening a data path during the normal program operation.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A method of controlling a page buffer wherein the page buffer includes transistors connected between bit lines bit lines and a pad, wherein the transistors are driven according to a first signal that is enabled according to a read enable signal upon read operation to output a first data of a memory cell from the bit lines to a node passing through the pad, and a dual register having first and second registers that are enabled according to a second signal enabled during first and second program operations to transmit a second data from a node passing through the pad to the bit lines, wherein during the first program operation, when a cache program signal that enables the second signal is kept at a first level and a write enable signal is toggled, the first signal shifts to a second level to turn on the transistors, so the data passing through the pad is directly transmitted to the bit lines through the transistors without passing through the first and second registers, and wherein during the second program operation the cache program signal and the read enable signal are kept at the second level to output the first signal disabling the transistors and the second signal enabling the first and second registers, so the data passing through the pad is transmitted to the bit lines through the first and second registers.

2. The method according to claim 1, wherein the transistors are NMOS transistors.

3. A control circuit of a page buffer, wherein the page buffer includes transistors connected between bit lines and a pad, wherein the transistors are driven according to a first signal that is enabled according to a read enable signal upon read operation to output a first data of a memory cell from the bit lines to a node passing through the pad, and a dual register having first and second registers that are enabled according to a second signal enabled during first and second program operations to transmit a second data from a node passing through the pad to the bit lines, wherein during the first program operation when, the read enable signal is kept at a second level, a cache program signal that enables the second signal is kept at a first level and a write enable signal is toggled, the first signal shifts to a second level to turn on the transistors, so the data passing through the pad is directly transmitted to the bit lines through the transistors without passing through the first and second registers, and wherein during the second program operation, the cache program signal and the read enable are kept at the second level to output the first signal disabling the transistors and the second signal enabling the first and second registers, so the data passing through the pad is transmitted to the bit lines through the first and second registers.

4. The control circuit according to claim 3, wherein the transistors are NMOS transistors.

* * * * *